United States Patent
Ng

(10) Patent No.: US 11,728,728 B2
(45) Date of Patent: *Aug. 15, 2023

(54) VOLTAGE SENSE CIRCUIT

(71) Applicant: Astec International Limited, Kowloon (HK)

(72) Inventor: Weng Fai Ng, Tko (HK)

(73) Assignee: Astec International Limited, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 17/453,548

(22) Filed: Nov. 4, 2021

(65) Prior Publication Data

US 2022/0181970 A1 Jun. 9, 2022

Related U.S. Application Data

(63) Continuation of application No. 17/112,000, filed on Dec. 4, 2020, now Pat. No. 11,183,927.

(51) Int. Cl.
| | |
|---|---|
| *H02J 9/06* | (2006.01) |
| *H02M 3/155* | (2006.01) |
| *H02M 1/44* | (2007.01) |
| *H02M 1/42* | (2007.01) |
| *G01R 19/10* | (2006.01) |

(52) U.S. Cl.
CPC ............ *H02M 3/155* (2013.01); *G01R 19/10* (2013.01); *H02M 1/42* (2013.01); *H02M 1/44* (2013.01)

(58) Field of Classification Search
CPC .......... H02M 3/155; H02M 1/42; H02M 1/44
See application file for complete search history.

(56) References Cited

U.S. PATENT DOCUMENTS

| | | | |
|---|---|---|---|
| 4,061,883 | A | 12/1977 | Chambers |
| 5,684,678 | A | 11/1997 | Barrett |

(Continued)

FOREIGN PATENT DOCUMENTS

| | | |
|---|---|---|
| TW | 200405644 A | 4/2004 |
| TW | M537765 U | 3/2017 |
| TW | 201722045 A | 6/2017 |

OTHER PUBLICATIONS

Extended European Search Report for EP Application No. 21192414.7, dated Feb. 16, 2022; 8 pages.

(Continued)

*Primary Examiner* — Jared Fureman
*Assistant Examiner* — Esayas G Yeshaw

(57) ABSTRACT power supply module comprises a voltage converter coupled to first and second inputs. The voltage converter comprises a boosting circuit configured to boost an input voltage and comprises an input voltage selector (IVS) selectively connect and disconnect the first and second inputs to the boosting circuit. A first sensing circuit is coupled to the first input and comprises a pair of inputs coupled to the first input, a rectifier assembly, a resistor bank coupled between the pair of inputs and the rectifier assembly, a sense resistor coupled to the rectifier assembly, and a voltage sensor coupled to the sense resistor. A DC converter is configured to generate and supply an auxiliary voltage to the first sensing circuit. The resistor bank filters an electromagnetic interference (EMI) signal transmitted from the DC converter to a value below a threshold value.

20 Claims, 5 Drawing Sheets

(56) References Cited

U.S. PATENT DOCUMENTS

| | | | |
|---|---|---|---|
| 5,825,137 A | 10/1998 | Titus | |
| 5,939,799 A | 8/1999 | Weinstein | |
| 6,031,299 A | 2/2000 | Stumfall et al. | |
| 10,027,220 B2 | 7/2018 | Ng et al. | |
| 10,340,685 B2 | 7/2019 | Cheng | |
| 10,340,808 B2 | 7/2019 | Ferencz et al. | |
| 10,355,601 B2 | 7/2019 | Liu et al. | |
| 10,498,257 B2 | 12/2019 | Ng et al. | |
| 10,798,818 B2 | 10/2020 | Ranganathan et al. | |
| 10,935,578 B1 | 3/2021 | Chen et al. | |
| 2004/0218410 A1 | 11/2004 | Yamada et al. | |
| 2011/0278925 A1 | 11/2011 | Sato et al. | |
| 2014/0021874 A1* | 1/2014 | Chen | H05B 45/3725 315/200 R |
| 2014/0077602 A1* | 3/2014 | Liu | H02J 1/102 307/64 |
| 2016/0285306 A1* | 9/2016 | Lee | H02J 9/061 |
| 2018/0076731 A1 | 3/2018 | Morin | |
| 2020/0280208 A1 | 9/2020 | Chen et al. | |

OTHER PUBLICATIONS

Taiwan Office Action for Taiwan Application No. 110131024, dated Jun. 29, 2022; 11 pages.

* cited by examiner

VOLTAGE SENSE CIRCUIT

FIELD

The present disclosure relates to the technical field of power supplies and in particular to a voltage sense circuit.

BACKGROUND

A power supply typically converts an incoming voltage into a different, output voltage. For example, an alternating current (AC) input voltage may be converted to a DC voltage for use by electronic equipment. A power supply may use multiple inputs coupled to respective voltage supplies for redundant operation. In a scenario where a primary source on a first input becomes undesirable, the power supply may switch to an alternate source on a second input to continue to deliver output power.

When the input source is an AC source, consideration for minimizing or eliminating noise due to electromagnetic interference (EMI) may result in the use of an EMI blocker such as a common-mode choke. The common-mode choke, however, can be a relatively large device occupying a large amount of space on a printed circuit board (PCB) and may not be desirable upstream of a voltage sensing circuit in a power supply with a high input power density requirement.

OVERVIEW

In accordance with one aspect, a power supply module comprises a first input configured to receive a first input voltage, a second input configured to receive a second input voltage, an output configured to supply a power supply voltage, and a voltage converter coupled to the first and second inputs and to the output. The voltage converter comprises a boosting circuit configured to boost one of the first input voltage and the second input voltage, an input voltage selector (IVS) coupled to the boosting circuit and coupled to the first and second inputs to selectively connect and disconnect the first and second inputs to the boosting circuit, a first sensing circuit coupled to the first input, a control circuit coupled to the IVS and to the first sensing circuit, and a direct current (DC) converter coupled to the boosting circuit. The first sensing circuit comprises a pair of inputs coupled to the first input, a rectifier assembly, a resistor bank coupled between the pair of inputs and the rectifier assembly, a sense resistor coupled to the rectifier assembly, and a voltage sensor coupled to the sense resistor. The control circuit is configured to control the IVS to select one of the first input and the second input based on a sense signal received from the first sensing circuit. The DC converter is configured to generate an auxiliary voltage and to supply the auxiliary voltage to the first sensing circuit. An electromagnetic interference (EMI) signal transmitted from the DC converter to the first sensing circuit is filtered to a value below a threshold value by the resistor bank.

In accordance with another aspect, a power supply unit comprises a power supply voltage input configured to receive a source voltage from each of a plurality of voltage sources, a power supply voltage output configured to supply a power supply voltage, and one or more power supply modules coupled to the power supply voltage input and to the power supply voltage output. Each power supply module comprises a pair of voltage inputs coupled to the power supply voltage input, an output coupled to the power supply voltage output, and a voltage converter. The voltage converter comprises an input voltage selector (IVS) coupled to the pair of voltage inputs and configured to transmit the source voltage from one of the plurality of voltage sources, a boost circuit coupled to the IVS and configured to boost the source voltage from the one of the plurality of voltage sources, a first sensing circuit, a control circuit coupled to the IVS and to the first sensing circuit, and a direct current (DC) converter coupled to the boost circuit. The first sensing circuit comprises a sensor input coupled to a first input of the pair of voltage inputs, a rectifier assembly, a plurality of resistors coupled between the sensor input and the rectifier assembly, a sense resistor coupled to the rectifier assembly, and a voltage sensor coupled to the sense resistor. The control circuit is configured to control the IVS to select one of the pair of voltage inputs based on a sense signal received from the first sensing circuit. The DC converter is configured to generate a first auxiliary voltage and to supply the first auxiliary voltage to the first sensing circuit. An electromagnetic interference (EMI) signal transmitted from the DC converter to the first sensing circuit is filtered to a value below a threshold value by the plurality of resistors.

In accordance with another aspect, a method of manufacturing a power supply module comprises forming a first sensing circuit having a sensor input and a sensor output and forming a voltage converter having at least two inputs configured to receive respective input voltages. Forming the first sensing circuit comprises coupling a resistor bank to the sensor input, coupling a rectifier assembly to the resistor bank, coupling a sense resistor to the rectifier assembly, and coupling a voltage sensor to the rectifier assembly. The resistor bank is serially coupled between the sensor input and the rectifier assembly. Forming the voltage converter comprises coupling an input voltage selector (IVS) to the at least two inputs, coupling a boosting circuit to the IVS, coupling a direct current (DC) converter to the boosting circuit, coupling the first sensing circuit to one of the at least two inputs and to the DC converter, and coupling a control circuit to the IVS and to the first sensing circuit. The boosting circuit is configured to boost the input voltage, and the DC converter configured to supply an auxiliary voltage. The control circuit is configured to receive a first sense signal from the first sensing circuit and control the IVS to selectively transmit one of the respective input voltages to the boosting circuit based on the first sense signal. The first sensing circuit is configured to receive the auxiliary voltage from the DC converter and reduce an electromagnetic interference (EMI) signal transmitted from the DC converter to a value below a threshold value via the resistor bank.

BRIEF DESCRIPTION OF THE DRAWINGS

The drawings illustrate embodiments presently contemplated for carrying out embodiments of the present disclosure.

In the drawings.

Figure 1:
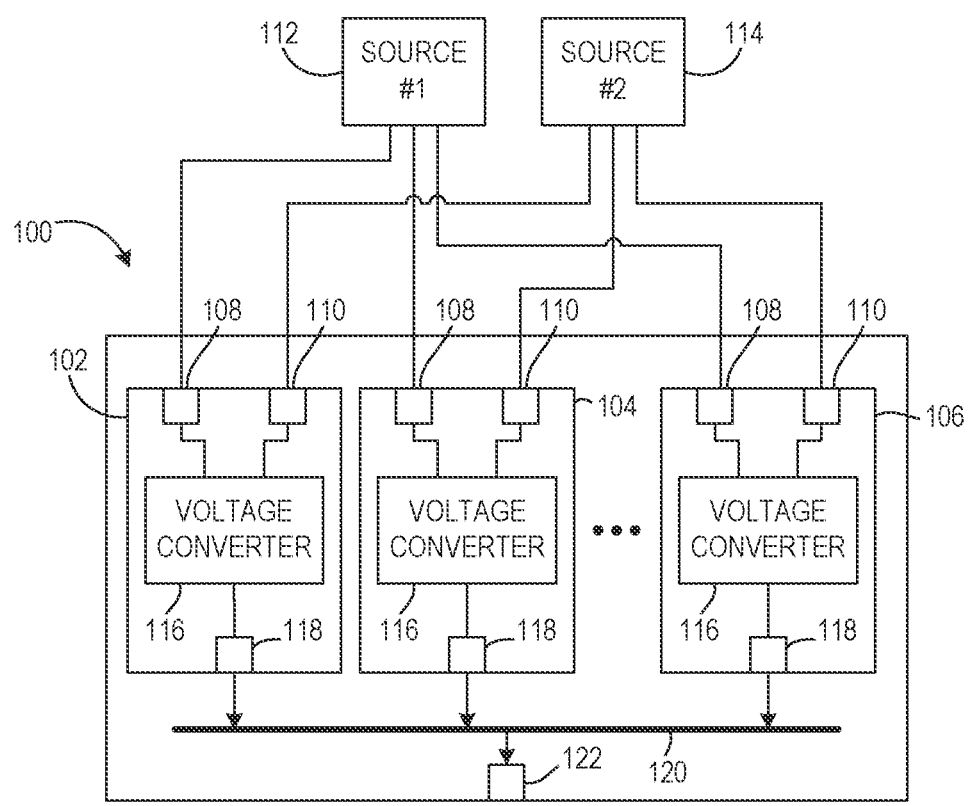
FIG. 1 is a block diagram of a power supply unit according to an embodiment of the present disclosure.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates a block diagram of a power supply unit 100 according to an embodiment of the present disclosure. Power supply unit 100 includes one or more power supply modules 102, 104, 106 configured to convert an input power into an output power. As illustrated, power supply unit 100 includes three power supply modules 102, 104, 106; however, embodiments of the present disclosure may include more or less than three modules.

Each power supply module includes a pair of source inputs 108, 110 for respectively receiving power from a first power source 112 and from a second power source 114. In one embodiment, the first and second power sources 112, 114 are alternating current (AC) sources supplying power from one or more AC sources such as the utility grid, generators, and the like. Alternatively, one or both of the first and second power sources 112, 114 may be a direct current (DC) source supplying power from one or more DC sources such as batteries, capacitor banks, and the like. In an example, the first power source 112 is a three-phase AC source from which a default AC feed is provided to the power supply modules 102, 104, 106 in separate phases such that each power supply module receives a different phase from the power source 112. In this same example, the second power source 114 may be another, distinct three-phase AC source from which a backup AC feed is provided to the power supply modules 102, 104, 106 in separate phases.

Each power supply module also includes a voltage converter 116 configured to convert the voltage from one of the first and second power sources 112, 114 into a different form and deliver the converted voltage to an output 118. For example, voltage converters 116 may be configured to convert the single-phase AC voltage received from the respective source input 108, 110 into a DC output voltage that is supplied from the output 118 to a voltage bus 120. From the voltage bus 120, the DC output voltage may be supplied to an output 122 of the power supply unit 100.

Figure 2:
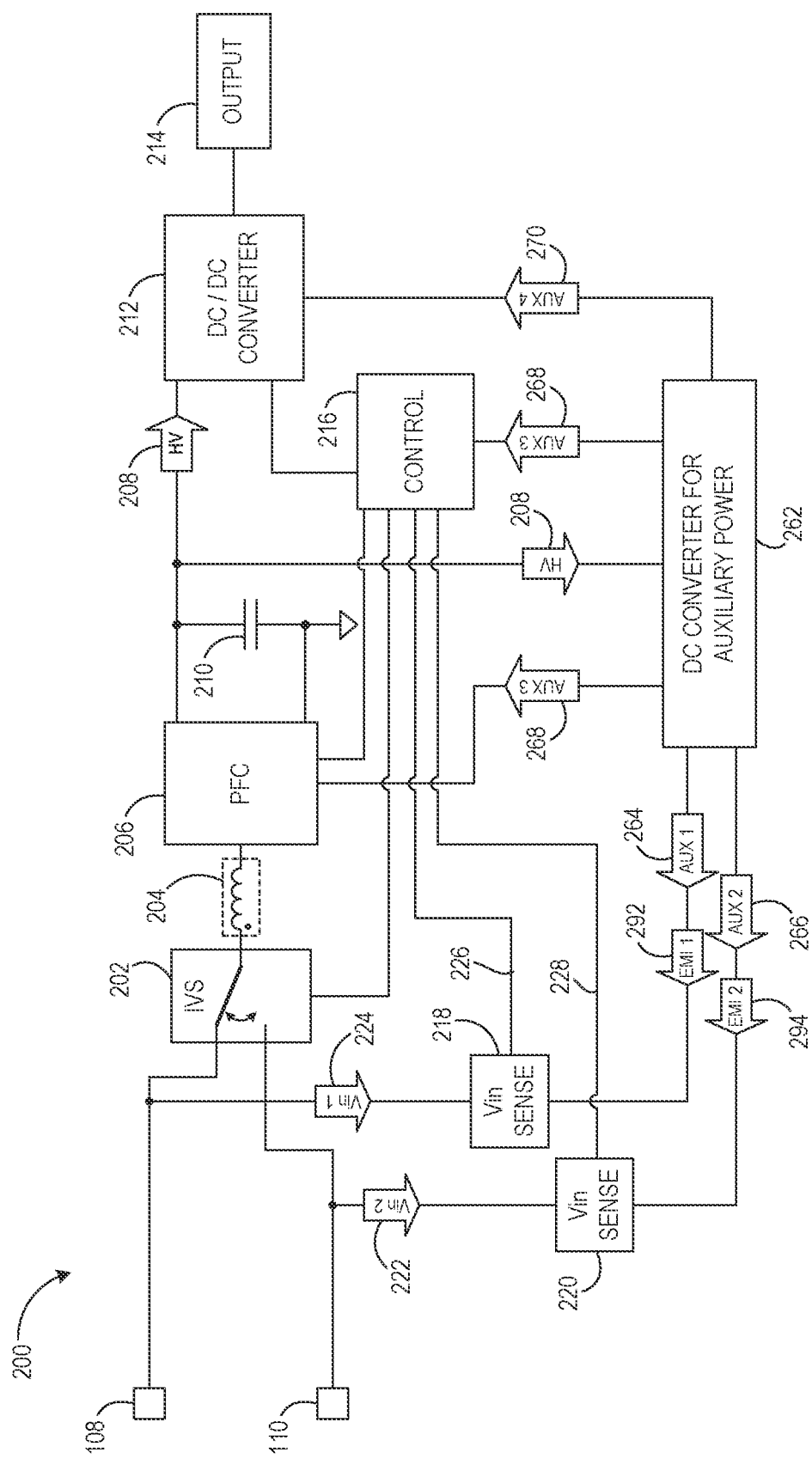
FIG. 2 is a block diagram of a voltage converter according to an embodiment of the present disclosure.

FIG. 2 illustrates a block diagram of a voltage converter 200 according to an embodiment of the present disclosure. The voltage converter 200 may describe any one of the voltage converters 116 shown in FIG. 1. The input voltages from the first and second power sources 112, 114 are provided to an input voltage selector (IVS) 202, which includes a relay (not shown) for selecting the voltage/power to be converted. For example, as shown, IVS 202 couples the voltage/power from the first power source 112 to be converted by the voltage converter 200. An electromagnetic interference (EMI) blocker 204 may be coupled to an output of the IVS 202 to block EMI transmitted through the IVS 202 from propagating through to the voltage conversion blocks downstream.

A boosting circuit such as a power factor correction (PFC) circuit 206 is configured to rectify and boost the input voltage from the IVS 202. The PFC circuit 206 may, therefore, rectify an AC voltage from the IVS 202 and boost the rectified voltage to supply a DC high voltage 208. The PFC circuit 206 may accept a voltage waveform in any shape, including pure DC voltage, and output the DC high voltage 208. A high-capacity capacitor 210 coupled to the output of the PFC circuit 206 may be used to maintain the DC high voltage 208 for a short holding time should the DC high voltage 208 be briefly lost from the PFC circuit 206.

A DC/DC converter 212 is coupled to receive the DC high voltage 208 from the PFC circuit 206 and convert the DC high voltage 208 to a DC low voltage output 214 such as 12 Vdc, 5 Vdc, and the like. The DC/DC converter 212 includes a transformer that provides isolation and forms part of the voltage conversion function. A main control circuit 216 is coupled to the IVS 202, the PFC circuit 206, and the DC/DC converter 212 and provides control signals for their operation. The control circuit 216 is configured to receive signals from a pair of sensing circuits 218, 220, each coupled to a respective input power source 112, 114. The sensing circuits 218, 220 operate to sense the input voltages Vin 1 222 and Vin 2 224 from input power sources 112, 114 and supply sense signals 226, 228 to the control circuit 216, which decides whether the input voltages 222, 224 meet operating requirements and thresholds. Based on the decision, the control circuit 216 decides which input power source 112, 114 to use and controls the IVS 202 accordingly. For example, if both input power source 112, 114 are operating within parameters, the first power source 112 may be always selected based on its designation as the default source as long as its parameters meet the incoming voltage thresholds. If, however, the voltage 222 from the first power source 112 becomes out-of-spec or otherwise falls outside operational thresholds and/or limits, the control circuit 216 may control the IVS 202 to use the backup input voltage 224 from the second power source 114 if the sense signal 228 from the second input sensing circuit 220 indicates that its power is within operational parameters. After the voltage input 222 from the first power source 112 returns to meet the appropriate operational parameters, its voltage may be once again selected as the voltage to be used through control of the IVS 202 by the control circuit 216.

Figure 3:
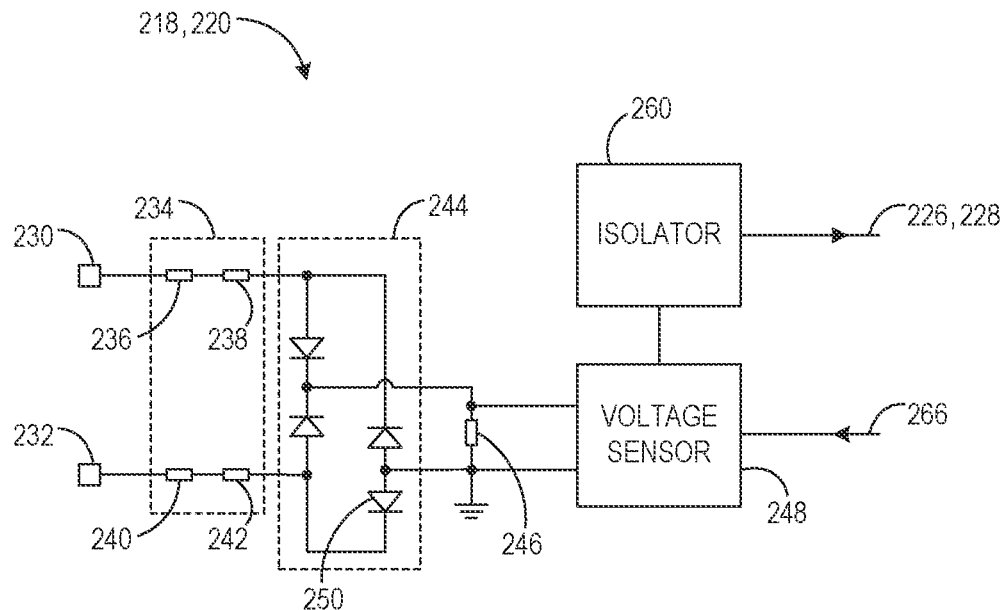
FIG. 3 is a schematic block diagram of a sensing circuit according to an embodiment of the present disclosure.

FIG. 3 illustrates a schematic block diagram of the sensing circuits 218, 220 according to an embodiment. A pair of voltage inputs 230, 232 are directly coupled to inputs for the first or second power source 112, 114 and receives Vin 1 222 or Vin 2 224 depending on which power source 112, 114 the sensing circuit is coupled to. The voltage input 230 may receive a line voltage, for example, while the voltage input 232 may receive a neutral line voltage in an embodiment where the incoming voltage is AC. A resistor bank 234 is coupled to the voltage inputs 230, 232 and has one or more resistors coupled to each voltage input 230, 232. As shown, for example, resistor bank 234 has two resistors 236, 238 coupled to the voltage input 230 and two resistors 240, 242 coupled to the voltage input 232. The resistors 236-242 can be large value resistors (e.g., 330K ohms) and may be capable of handling large voltages (e.g., 400 V) so that when combined, a high differential mode voltage surge (e.g., 1600 V) may be sustained without negative effects. For higher differential mode voltage surge requirements (e.g., 2000 V), for example, additional resistors may be coupled in series.

Figure 4:
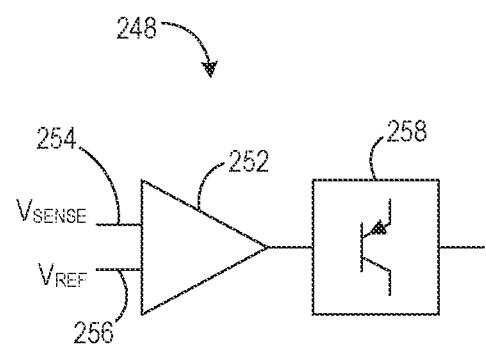
FIG. 4 is a schematic block diagram of a portion of a voltage sensor according to an embodiment of the present disclosure.

The input voltage 222, 224 passes from the resistor bank 234 to a rectifier 244 that rectifies the input voltage 222, 224 (e.g., from AC to DC) and supplies the rectified voltage to a sense resistor 246, which generates a sense voltage, $V_{sense}$, supplied to a voltage sensor 248. In one example, rectifier 244 includes four diodes 250 arranged in a full-wave bridge rectifier arrangement. Referring to FIG. 4, a schematic block diagram of a portion of the voltage sensor 248 of FIG. 3 is shown. The voltage sensor 248 includes a comparator 252 having a first input 254 for the sense voltage, $V_{sense}$, and having a second input 256 for a reference voltage, $V_{ref}$. The reference voltage, $V_{ref}$, is designed so that a comparison of the sense voltage with the reference voltage controls a switch circuit 258 to indicate a status of the input voltage 222, 224. The switch circuit 258 may be switched on or switched into a conductive state, for example, to indicate that the input voltage 222, 224 meets the parameters for the incoming voltage thresholds. When the switch circuit 258 is switched off or in a non-conductive state, the input voltage 222, 224 may be indicated to fail one or more of the parameters set for allowable input voltages 222, 224. The voltage sensor 248 illustrated in FIG. 4, however, is merely one example of a sensing circuit, and other embodiments may be used without deviating from the scope of this disclosure. Referring to FIGS. 3 and 4, the output of the switch circuit 258 may be provided to an isolator 260 such as an optoisolator for generating the respective sense signal 226, 228 sent to the control circuit 216 for deciding which power source 112, 114 to use.

The resistor bank 234 obviates the placement of an inductive EMI choke at the input of the sensing circuit 218, 220 for handling of EMI effects coming from the power sources 112, 114. Instead, the resistor bank 234 effectively filters any EMI noise to values below a threshold value. The use of the resistors 236-242 allows for the realization of space savings in printed circuit board (PCB) real estate and cost compared with an inductive EMI choke (e.g., a toroid wound inductor) of equivalent EMI filtering capacity.

Figure 5:
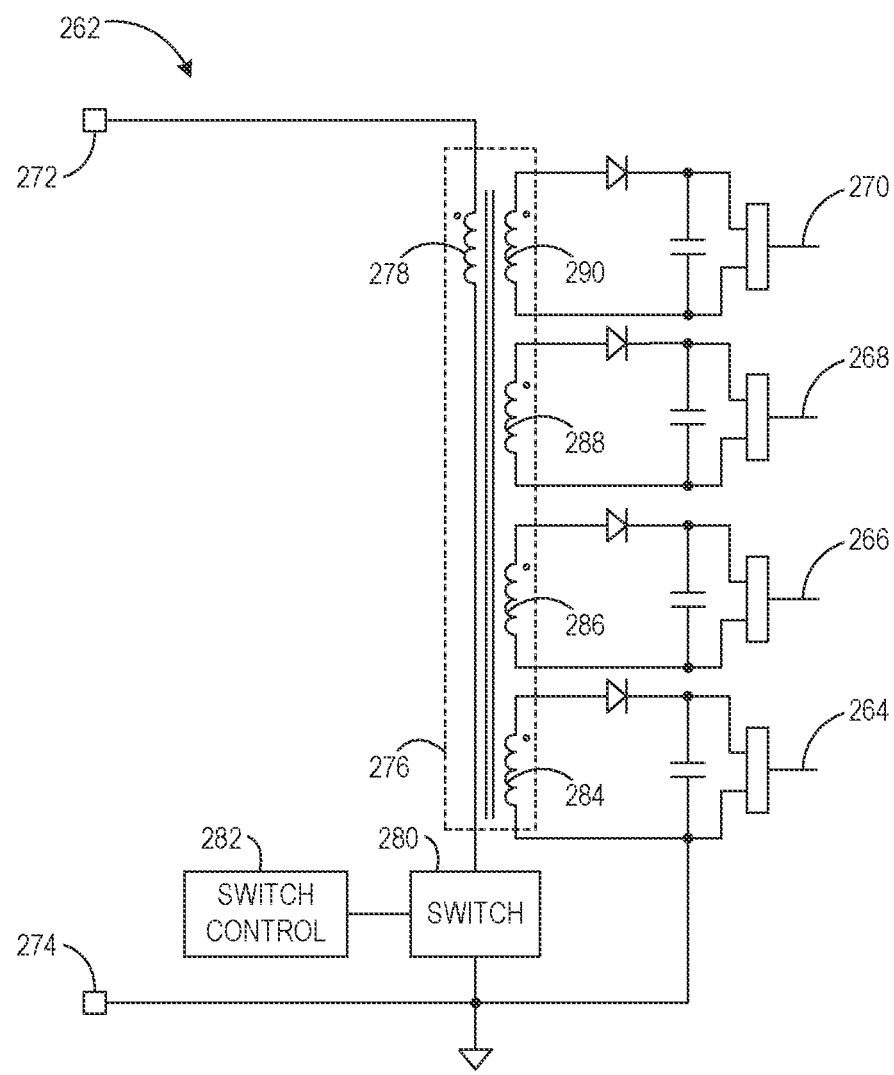
FIG. 5 illustrates an example schematic block diagram of a portion of the DC converter of FIG. 2 according to an embodiment of the present disclosure.

Referring back to FIG. 2, the voltage converter 200 also includes a DC converter 262 to convert a portion of the DC high voltage 208 into one or more auxiliary voltages 264, 266, 268, 270 for use throughout the voltage converter 200. Referring to FIG. 5, is illustrated, a pair of voltage inputs 272, 274 are coupled to the PFC circuit 206 to receive a portion of the DC high voltage 208 therefrom. A transformer 276 has a primary winding 278 coupled to a switch 280 such as a transistor that is controlled by a switch control 282 to generate inductive voltages in secondary windings 284, 286, 288, 290 to produce the auxiliary voltages 264, 266, 268, 270. While the illustrated example shows four auxiliary voltages, embodiments of the present disclosure contemplate that more or fewer auxiliary voltages may be supplied by the DC converter 262.

Referring back to FIG. 2, first and second auxiliary voltages 264, 266 may be provided to sensing circuits 218, 220 (as illustrated in FIG. 3), respectively. A third auxiliary voltage 268 may be provided to the PFC circuit 206 and to the control circuit 216. A fourth auxiliary voltage 270 may be provided to the DC/DC converter 212. Any EMI 292, 294 experienced by or generated in the DC converter 262 may be transferred to the respective sensing circuits 218, 220 along with the auxiliary voltages 264, 266. With inadequate attenuation, the sensing circuits 218, 220 may transfer the EMI through the rectifier 244 and voltage inputs 230, 232 back out to the power sources 112, 114, which is undesirable. However, the sensing circuits 218, 220 disclosed herein effectively filter the EMI from the DC converter 262 via the resistor bank 234 to value levels below a threshold value prior to the EMI reaching the power sources 112, 114 according to embodiments of the present disclosure. Accordingly, larger and more costly EMI blocking/filtering components such as toroidally-wound inductive coils can be avoided in the sensing circuitry such that no inductive coil for blocking EMI is placed between the rectifier 244 of the sensing circuits 218, 220 and the source inputs 108, 110. The threshold value may be decided by one or more regulatory rules defining the amount of acceptable EMI in the industry. For example, EMI values above the threshold value are typically labelled as failing EMI blocking initiatives.

Figure 6:
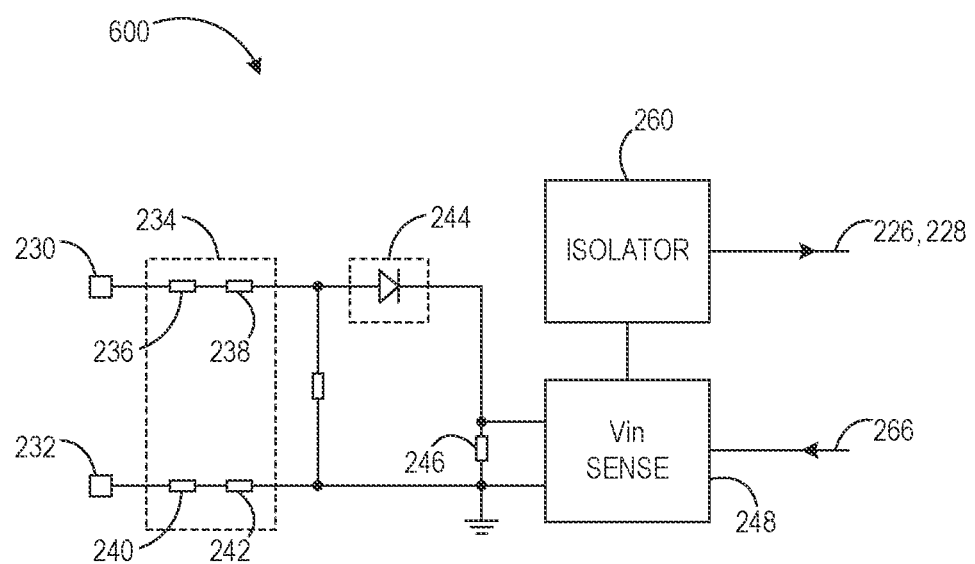
FIG. 6 is a schematic block diagram of a voltage converter according to another embodiment of the present disclosure.

FIG. 6 illustrates a block diagram of a voltage converter 600 according to another embodiment of the present disclosure. The voltage converter 600 has similar components depicted for the sensing circuit shown in FIG. 3 but the rectifier 244 is illustrated as a half-wave rectifier. An appropriate selection of the reference voltage, $V_{ref}$, may be used to indicate behavior of the input voltage 222, 224 based on using a half-wave rectified signal versus the full-wave rectified signal illustrated in FIG. 3.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

What is claimed is:

1. A power supply module comprising:
    an input voltage selector (IVS) configured to selectively connect and disconnect a first input and a second input to a boosting circuit;
    a first sensing circuit coupled to the first input and comprising a resistor bank;
    a control circuit coupled to the IVS and to the first sensing circuit, the control circuit configured to control the IVS to select one of the first input and the second input based on a sense signal received from the first sensing circuit; and a direct current (DC) converter coupled to the first sensing circuit and configured to generate an auxiliary voltage and to supply the auxiliary voltage to the first sensing circuit;

wherein an electromagnetic interference (EMI) signal transmitted from the DC converter to the first sensing circuit is filtered to a value below a threshold value by the resistor bank.

2. The power supply module of claim 1, wherein the first sensing circuit further comprises:
a pair of inputs coupled to the first input;
a rectifier assembly;
a sense resistor coupled to the rectifier assembly; and
a voltage sensor coupled to the sense resistor;
wherein the resistor bank is coupled between the pair of inputs and the rectifier assembly.

3. The power supply module of claim 2, wherein the resistor bank comprises:
one or more resistors coupled between the rectifier assembly and a first input of the pair of inputs; and
one or more resistors coupled between the rectifier assembly and a second input of the pair of inputs.

4. The power supply module of claim 2, wherein the rectifier assembly comprises four diodes arranged in a full-wave bridge rectifier arrangement.

5. The power supply module of claim 2, wherein the power supply module is absent a toroidally-wound inductive coil between the rectifier assembly and the first input for reducing EMI.

6. The power supply module of claim 2 further comprising a second sensing circuit coupled to the second input and comprising:
a pair of inputs coupled to the second input;
a rectifier assembly;
a resistor bank coupled between the pair of inputs of the second sensing circuit and the rectifier assembly of the second sensing circuit;
a sense resistor coupled to the rectifier assembly of the second sensing circuit; and
a voltage sensor coupled to the sense resistor of the second sensing circuit.

7. The power supply module of claim 2, wherein the first sensing circuit further comprises an isolator coupled to the voltage sensor and to the control circuit, the isolator configured to electrically isolate the first sensing circuit from the control circuit.

8. The power supply module of claim 2, wherein the boosting circuit comprises a power factor correction circuit configured to convert a first input voltage from an alternating current (AC) voltage into a DC voltage.

9. The power supply module of claim 8, further comprising a DC/DC converter configured to convert the DC voltage into a lower, output DC voltage.

10. A power supply unit comprising:
a voltage converter comprising:
an input voltage selector (IVS) configured to transmit a source voltage from one of a plurality of voltage sources;
a first sensing circuit comprising:
a sensor input coupled to a first input of the IVS; and
a plurality of resistors coupled to the sensor input;
a control circuit coupled to the IVS and to the first sensing circuit, the control circuit configured to control the IVS to select the source voltage from a pair of voltage inputs based on a sense signal received from the first sensing circuit; and
a direct current (DC) converter coupled to the first sensing circuit and configured to generate a first auxiliary voltage and to supply the first auxiliary voltage to the first sensing circuit;
wherein an electromagnetic interference (EMI) signal transmitted from the DC converter to the first sensing circuit is filtered to a value below a threshold value by the plurality of resistors.

11. The power supply unit of claim 10, wherein the power supply unit further comprises:
a power supply voltage input configured to receive a source voltage from each of the plurality of voltage sources;
a power supply voltage output configured to supply a power supply output voltage;
a power supply module coupled to the power supply voltage input and to the power supply voltage output, the power supply module comprising:
a pair of voltage inputs coupled to the power supply voltage input;
an output coupled to the power supply voltage output; and
the voltage converter.

12. The power supply unit of claim 11, wherein the sensor input comprises a first sensor input coupled to a first input connection of a first input of the pair of voltage inputs;
wherein the sensor input further comprises a second sensor input coupled to a second input connection of the first input of the pair of voltage inputs;
wherein the first sensing circuit further comprises a rectifier assembly; and
wherein the plurality of resistors comprises:
one or more resistors coupled between the rectifier assembly and the first sensor input; and
one or more resistors coupled between the rectifier assembly and the second sensor input.

13. The power supply unit of claim 12, wherein the first input connection comprises a line voltage of the first input of the pair of voltage inputs; and
wherein the second input connection comprises a neutral line voltage of the first input of the pair of voltage inputs.

14. The power supply unit of claim 12, wherein the power supply module is absent a toroidally-wound inductive coil between the rectifier assembly and the first input of the pair of voltage inputs for reducing EMI.

15. The power supply unit of claim 11 further comprising a second sensing circuit comprising:
a sensor input coupled to a second input of the pair of voltage inputs;
a rectifier assembly;
a plurality of resistors coupled between the sensor input of the second sensing circuit and the rectifier assembly of the second sensing circuit;
a sense resistor coupled to the rectifier assembly of the second sensing circuit; and
a voltage sensor coupled to the sense resistor of the second sensing circuit.

16. The power supply unit of claim 11, wherein the power supply module comprises a first power supply module configured to receive a first phase of the source voltage from a first voltage source of the plurality of voltage sources and to receive a first phase of the source voltage from a second voltage source of the plurality of voltage sources;

wherein the power supply unit further comprises a second power supply module configured to receive a second phase of the source voltage from the first voltage source of the plurality of voltage sources and to receive a second phase of the source voltage from the second voltage source of the plurality of voltage sources; and wherein the power supply unit further comprises a third power supply module configured to receive a third phase of the source voltage from the first voltage source of the plurality of voltage sources and to receive a third phase of the source voltage from the second voltage source of the plurality of voltage sources.

17. The power supply unit of claim 10, wherein the first sensing circuit further comprises an optoisolator coupled to the control circuit, the optoisolator configured to transmit the sense signal to the control circuit.

18. The power supply unit of claim 10, wherein the voltage converter comprises a power factor correction circuit configured to convert the source voltage from the one of the plurality of voltage sources from an alternating current (AC) voltage into a DC voltage; and wherein the voltage converter further comprises a DC/DC converter configured to convert the DC voltage into a lower, output DC power supply voltage.

19. A method comprising:

transmitting, via an input voltage selector (IVS), a source voltage from one of a plurality of voltage sources to a power supply module;

generating, via a sensing circuit, a sense voltage based on the source voltage, wherein the sensing circuit comprises a sensor input, a sense resistor, and a resistor bank coupled between the sensor input and the sense resistor;

comparing the sense voltage to a reference voltage;

transmitting a sense signal to a control circuit;

controlling the IVS to select the source voltage based on the sense signal; and generating and supplying an auxiliary voltage to the sensing circuit; and filtering an electromagnetic interference (EMI) signal within the auxiliary voltage to a value below a threshold value via the resistor bank.

20. The method of claim 19, wherein filtering the EMI signal comprises filtering the EMI signal without a toroidally-wound inductive coil.

* * * * *